United States Patent [19]

Kim

[11] Patent Number: 5,413,961
[45] Date of Patent: May 9, 1995

[54] METHOD FOR FORMING A CONTACT OF A SEMICONDUCTOR DEVICE

[75] Inventor: Jae K. Kim, Kyoungki, Rep. of Korea

[73] Assignee: Hyundai Electronics Industries Co., Ltd., Kyoungki, Rep. of Korea

[21] Appl. No.: 152,707

[22] Filed: Nov. 16, 1993

[30] Foreign Application Priority Data

Nov. 16, 1992 [KR] Rep. of Korea .................. 92-21471

[51] Int. Cl.$^6$ ..................... H01L 21/44; H01L 21/48
[52] U.S. Cl. ................... 437/195; 437/189;
437/228; 148/DIG. 20; 148/DIG. 50
[58] Field of Search .............. 437/52, 189, 195, 225,
437/228, 187; 148/DIG. 20, DIG. 50

[56] References Cited

U.S. PATENT DOCUMENTS

5,284,787 2/1994 Ahn ....................................... 437/52

Primary Examiner—Olik Chaudhuri
Assistant Examiner—H. Jey Tsai
Attorney, Agent, or Firm—Popham, Haik, Schnobrich & Kaufman, Ltd.

[57] ABSTRACT

A method for forming contact of a semiconductor device which prevents residues of a conductive material due to high steps on an insulating layer between metal lines, and minimizes contact area, includes the steps of forming an impurity diffusion region on a predetermined portion of an isolation region on a substrate, forming a first insulating layer on the surface of the substrate, forming a first conductive pattern and a second insulating pattern on the upper portion of the first insulating layer, forming a barrier pattern on the upper portion of the second insulating pattern, forming a third insulating layer on the upper portion of the barrier pattern and the first insulating layer, and etching the third insulating layer to expose the upper portion of the barrier pattern, forming a photoresist pattern for contact mask on the surfaces of the barrier pattern and third insulating layer, etching the third insulating layer and first insulating layer exposed by the photoresist pattern to form a contact hole having a lower surface being the impurity diffusion region, forming a spacer along the sidewall of the contact hole, and forming a second conductive layer on the upper portion of the substrate having the contact hole and barrier layer, and patterning the second conductive layer.

9 Claims, 9 Drawing Sheets

METHOD FOR FORMING A CONTACT OF A SEMICONDUCTOR DEVICE

BACKGROUND OF THE INVENTION

1. Field of the Invention

The present invention relates to a method for forming contact to allow circuit elements formed on a highly-integrated semiconductor substrate to be electrically connected to multi-layered metal lines, and more particularly to a method for forming self-aligned contact capable of improving packing density of a semiconductor device by minimizing the contact area.

2. Description of the Prior Art

Generally, a semiconductor device having integrated circuits such as dynamic random access memories (DRAMs) includes contact electrically connected to a drain diffusion region of penetrating an insulating layer between adjacent gates of a field-effect transistor. The contact functions to extract an electrode at the drain diffusion region by connecting the drain diffusion region to the metal lines.

The self-aligned contact minimizes not only a spacing between adjacent gates but also a contact hole area formed into the insulating layer between the adjacent gates to increase the packing density of the semiconductor device. However, the self-aligned contact has a problem of involving shorts between the metal lines and gate electrodes having high critical steps caused by critical-area deviation of a mask, tolerance of misalignment, distortion of lens, thickness of the insulating layer, etc. The problem of the conventional self-aligned contact will be described with reference to FIGS. 1 to 3.

Figure 1:
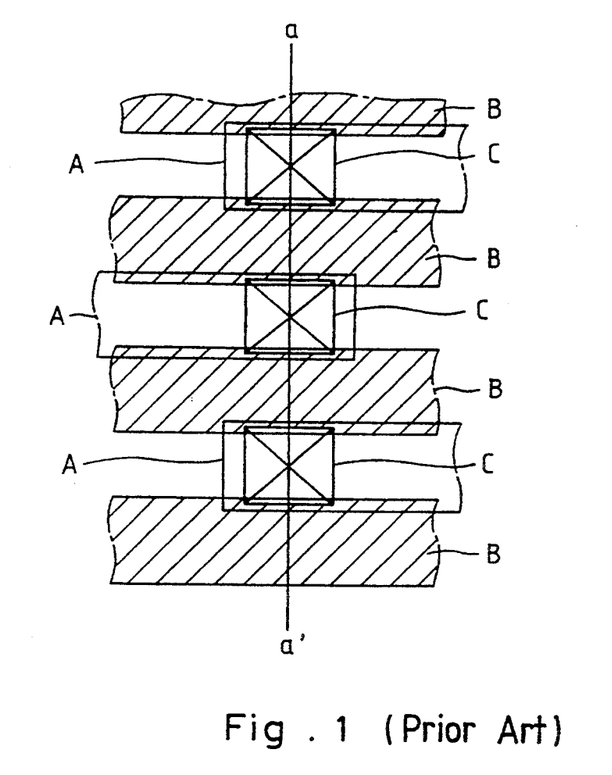
FIG. 1 is a layout showing contact regions and bit lines of a semiconductor device.

FIG. 1 shows a layout of a semiconductor device having four bit line regions B arranged between active regions A of a predetermined width, and contact regions C disposed to overlap the bit line regions at the upper and lower ends of them. In order to improve the packing density of the semiconductor device, the bit line regions A are arranged to be close to each other as much as possible. The self-aligned contact occupying a smaller area is formed in the contact region C to minimize the spacing between the bit line regions B (i.e., the width of the active region A).

FIGS. 2A to 2D are sectional views showing the semiconductor device, taken along line a—a' of FIG. 1, which illustrate steps of forming the conventional self-aligned contact.

Figure 2A:
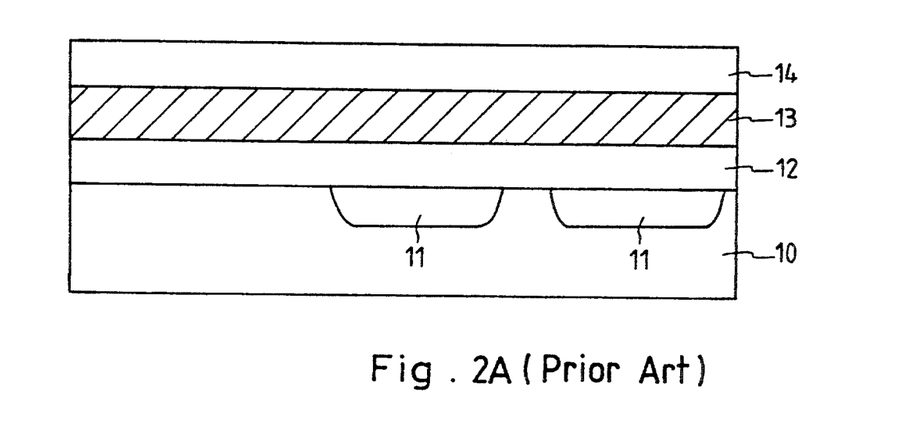
FIGS. 2A to 2D are sectional views illustrating steps of forming self-aligned contact according to one example of a method for forming contact of a conventional semiconductor device.

Referring to FIG. 2A, the semiconductor device includes a substrate 10 having impurity diffusion regions 11 which are provided in the active region A shown in FIG. 1 and separated from each other by a field oxide layer (not shown) formed on an unshown field region. A first insulating layer 12, a first conductive layer 13 and a second insulating layer 14 are sequentially formed on the surface of the substrate 10.

Figure 2B:
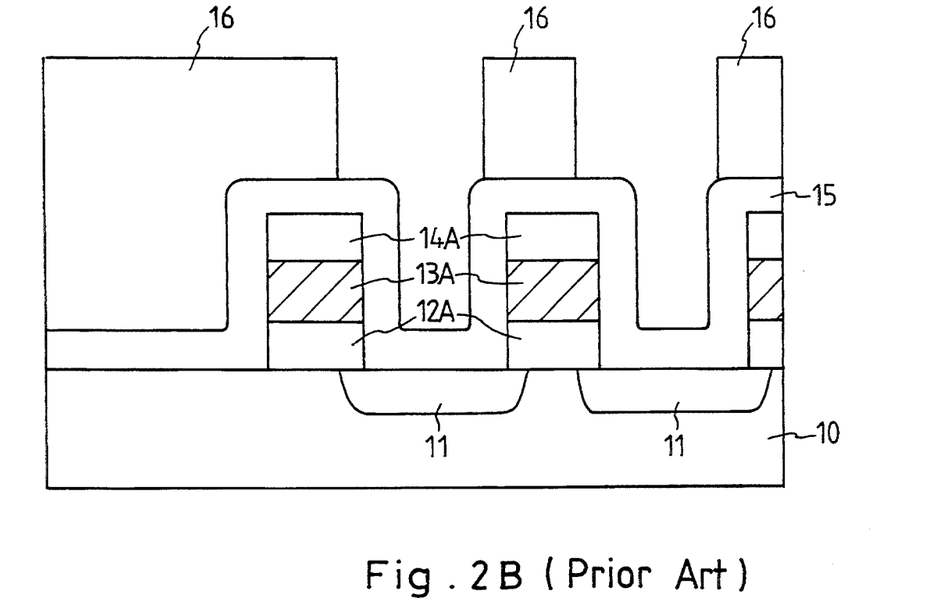

As shown in FIG. 2B, the first insulating layer 12, first conductive layer 13 and second insulating layer 14 are sectioned to be a first insulating pattern 12A, a first conductive pattern 13A and a second insulating pattern 14A, which are formed by etching portions of the first insulating layer 12, first conductive layer 13 and second insulating layer 14 formed on the impurity diffusion region 11, using a bitline mask. The first conductive pattern 13A serves as the bit line. A third insulating layer 15 is formed over the surface of the substrate 10 having the first insulating pattern 12A, first conductive pattern 13A and second insulating pattern 14A thereon, and a photoresist pattern 16 for contact mask is formed on the third insulating layer 15.

Figure 2C:
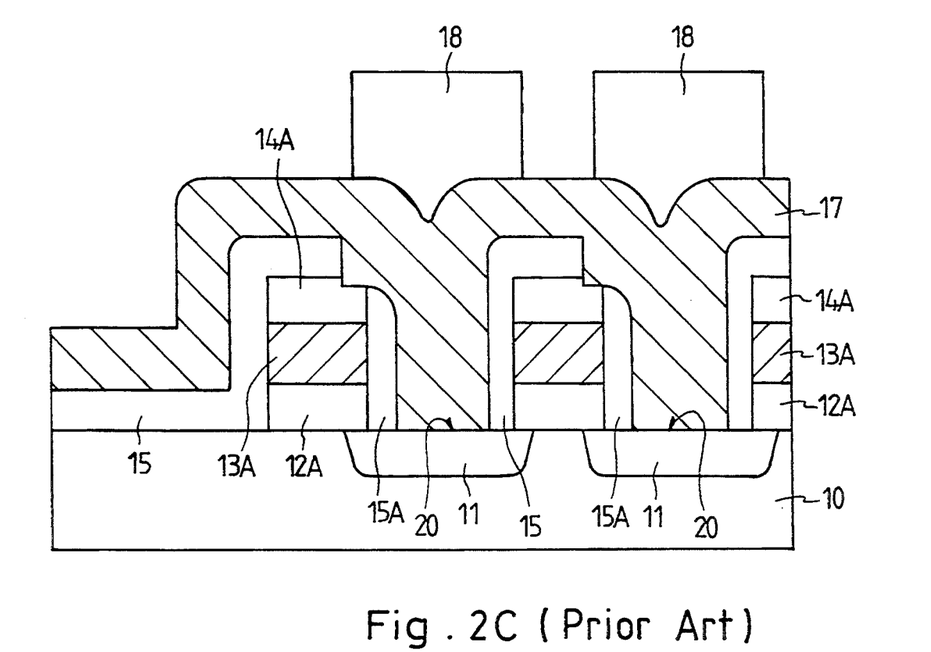

FIG. 2C illustrates a contact hole 20 formed by etching the third insulating layer 15 exposed by the photoresist pattern 16 to expose both a predetermind upper portion of the second insulating pattern 14A and the surface of the impurity diffusion region 11, and a spacer 15A formed of the third insulating material. The photoresist pattern 16 shown in FIG. 2B is removed after the etching process. The spacer 15A is placed along the sidewalls of the first insulating pattern 12A, first conductive pattern 13A and second insulating pattern 14A. A second conductive layer 17 on the contact hole 20 is formed by depositing a metal, and a photoresist pattern 18 for storage electrode mask is formed on the second conductive layer 17.

Figure 2D:
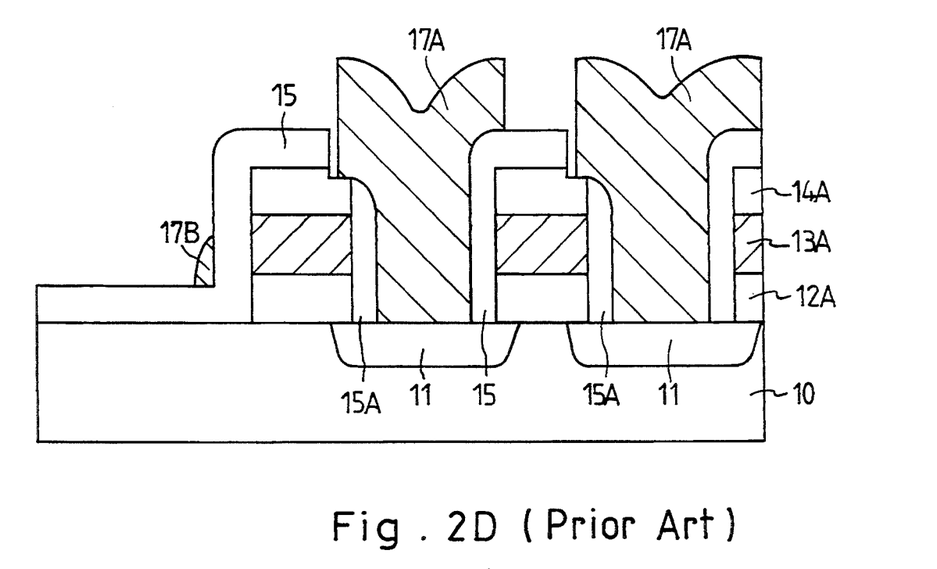

Referring to FIG. 2D, a second conductive pattern 17A is formed by selectively etching the third conductive layer 17 exposed by the photoresist pattern 18 shown in FIG. 2C. The photoresist pattern 18 is removed after the etching process of the second conductive layer 17 is carried out. Residue 17B of the third conductive layer 17 remaining on the steps of the third insulating layer 15 without being eliminated during the etching process of the second conductive layer 17 is originated due to the relatively high step at the surface of the third insulating layer 15. The residue of the third conductive layer 17 induces shorts in other metal lines to be formed later in a step followed by the contact formation step to therefore degrade the semiconductor device.

For the purpose of preventing the high steps of the insulating layer and eliminating the conductive material remaining at the surface of the insulating layer according to the conventional method for forming the self-aligned contact as shown in FIGS. 2A to 2D, another method for forming the self-aligned contact has been suggested which will be described with reference to FIGS. 3A to 3C.

Figure 3A:
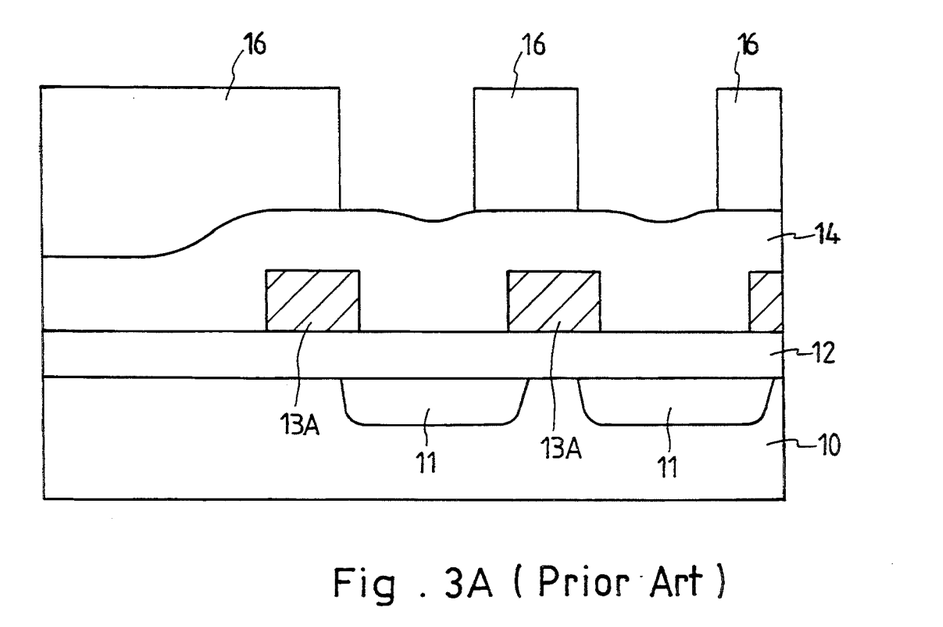
FIGS. 3A to 3C are sectional views illustrating steps of forming self-aligned contact according to another example of the method for forming the contact of the conventional semiconductor device.

Referring to FIG. 3A, a semiconductor device includes a substrate 10 having an impurity diffusion region 11 on a predetermined portion thereof, a first insulating layer 12 on the surface of the substrate 10, and a first conductive pattern 13A for gate electrode patterned on the first insulating layer 12. A second insulting layer 14 which will be used as an insulating interlayer is deposited on the upper portion of the first conductive pattern 13A and first insulating layer 12. Also, a photoresist pattern 16 for contact mask is formed on the second insulating layer 14.

Figure 3B:
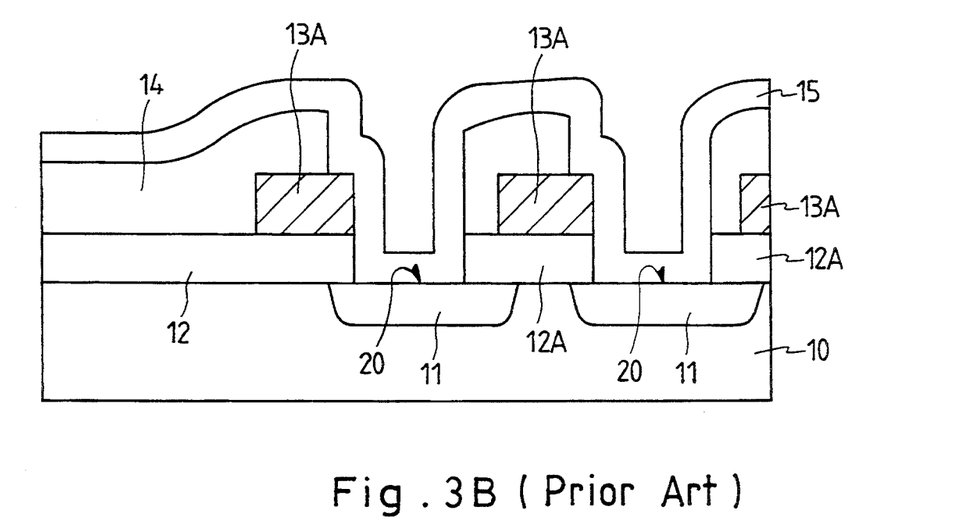

A contact hole 20 shown in FIG. 3B is formed by etching the second insulating layer 14 exposed by the photoresist pattern 16 and the first insulating layer 12 positioned under the exposed second insulating layer 14. The photoresist pattern 16 is removed after forming the contact hole 20. The lower surface of the contact hole 20 is in contact with the surface of the impurity diffusion region 11. Then, a third insulating layer 15 is formed both in the contact hole 20 and over the surface of the second insulating layer 14.

Figure 3C:
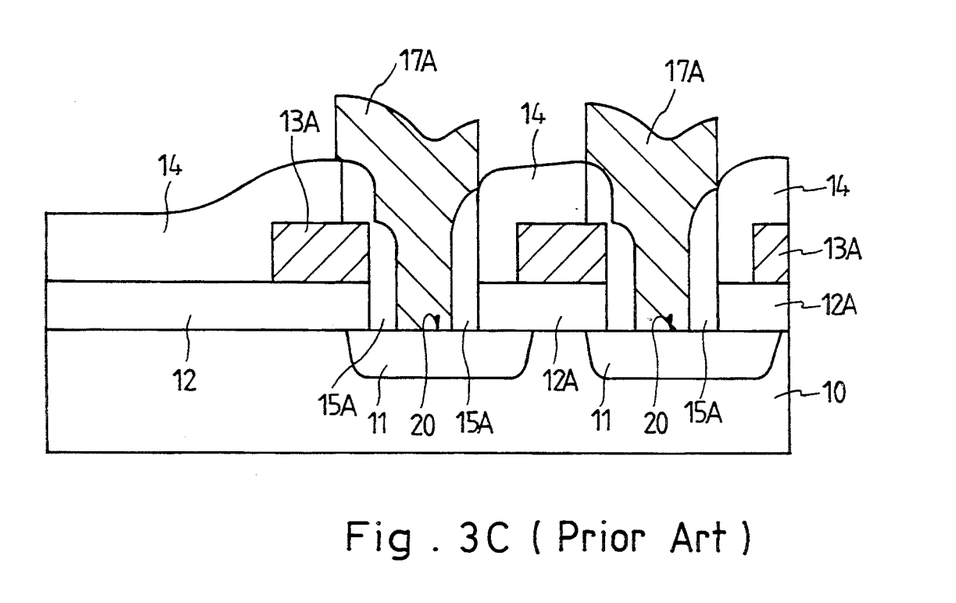

FIG. 3C illustrates a step of etching-back the third insulating layer 15 formed by the step shown in FIG. 3B to expose the impurity diffusion region 11, thereby forming a spacer 15A of the third insulating material along the sidewall of a gate electrode pattern consisting of the first insulating layer 12, first conductive pattern 13A and second insulating layer 14, and along the sidewall of the contact hole 20 consisting of a first insulating layer pattern 12A and a second insulating pattern 14A. A second conductive pattern 17A electrically connected to the impurity diffusion region 11 on the substrate 10 is formed by a mask-patterning process of depositing a second conductive layer 17 in the contact hole 20 and on the upper portion of the second insulating layer 14 having the spacer 15A and selectively removing the second conductive layer 17.

However, the method for forming the conventional self-aligned contact as shown in FIGS. 3A to 3C has a problem of inducing shorts at the first conductive layer 13A and second conductive pattern 17A when the portions of the third insulating layer 15 stacked on the surface of the second insulating layer 14 and stacked on the impurity diffusion region 11 are thicker than the portion of the third insulating layer 15 stacked on the surface of the exposed first conductive pattern 13A. In addition to the short, since the third conductive layer 15 stacked on the upper portion of the first conductive pattern 13A must be thickened to prevent the short at the first and second conductive patterns 13A and 17A, the spacing of gate pattern used as the bit lines and contact area cannot be reduced to below a predetermined size.

SUMMARY OF THE INVENTION

Therefore, it is an object of the present invention to provide a method for forming contact of a semiconductor device capable of preventing residue of a conductive material remaining on an insulating layer between metal lines caused by high steps, and minimizing a contact area.

To achieve the above object of the present invention, a method for forming contact of a semiconductor device includes steps of:

forming an impurity diffusion region on a predetermined portion of an isolation region on a substrate;

forming a first insulating layer on the surface of the substrate;

forming a first conductive pattern and a second insulating pattern on the upper portion of the first insulating layer;

forming a barrier pattern on the upper portion of the second insulating pattern;

forming a third insulating layer on the upper portion of the barrier pattern and the first insulating layer, and etching the third insulating layer to expose the upper portion of the barrier pattern;

forming a photoresist pattern for contact mask on the surfaces of the barrier pattern and third insulating layer;

etching the third insulating layer and first insulating layer exposed by the photoresist pattern to form a contact hole having a lower surface being the impurity diffusion region;

forming a spacer along the sidewall of the contact hole; and forming a second conductive layer on the upper portion of the substrate having the contact hole and barrier layer, and patterning the second conductive layer.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

Figure 4A:
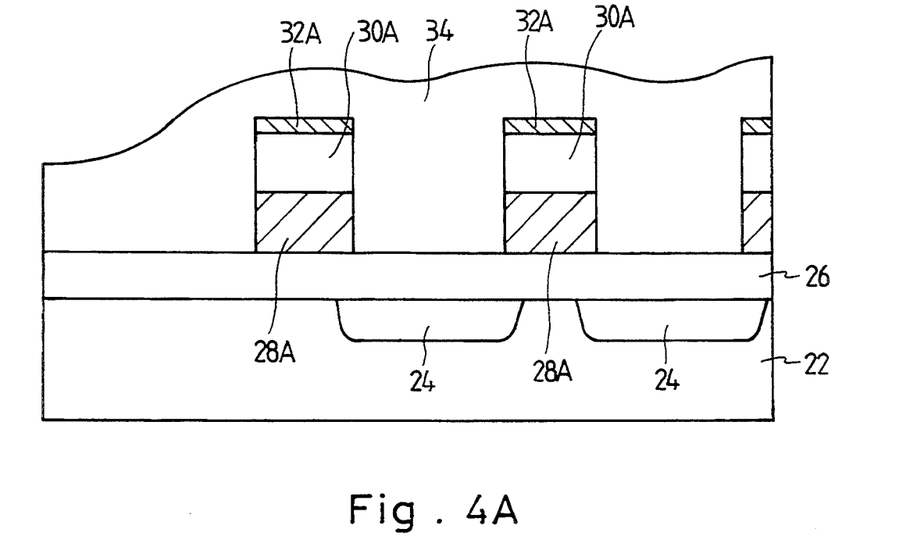
FIGS. 4A to 4E are sectional views illustrating steps of forming self-aligned contact by a first embodiment of a method for forming contact of a semiconductor device according to the present invention.

Referring to FIG. 4A, a semiconductor device includes a first insulating layer 26 of an oxide layer on the surface of a substrate 22 having an impurity diffusion region 24 on a predetermined portion thereof, and first conductive pattern 28A, a second insulating pattern 30A and a barrier pattern 32A sequentially stacked on the first insulating layer 26.

The first conductive pattern 28A, second insulating pattern 30A and barrier pattern 32A are formed in such a manner that a first conductive layer 28, a second insulating layer 30 and barrier layer 32 are sequentially stacked on the surface of the first insulating layer 26, and then selectively etched, using a bitline mask. The semiconductor device further has a third insulating layer 34 formed over the surface of the first insulating layer 26 and the upper portion of the barrier pattern 32. The third insulating layer 34 is formed of an insulating material such as a boro-phosphor-silicate glass (BPSG) and spin-on-glass (SOG) to have a planarized surface. The first conductive layer 28 may be formed of a polysilicon, the second insulating layer 30 is of an oxide layer, and the barrier layer 32 is of a silicon or nitride layer.

Figure 4B:
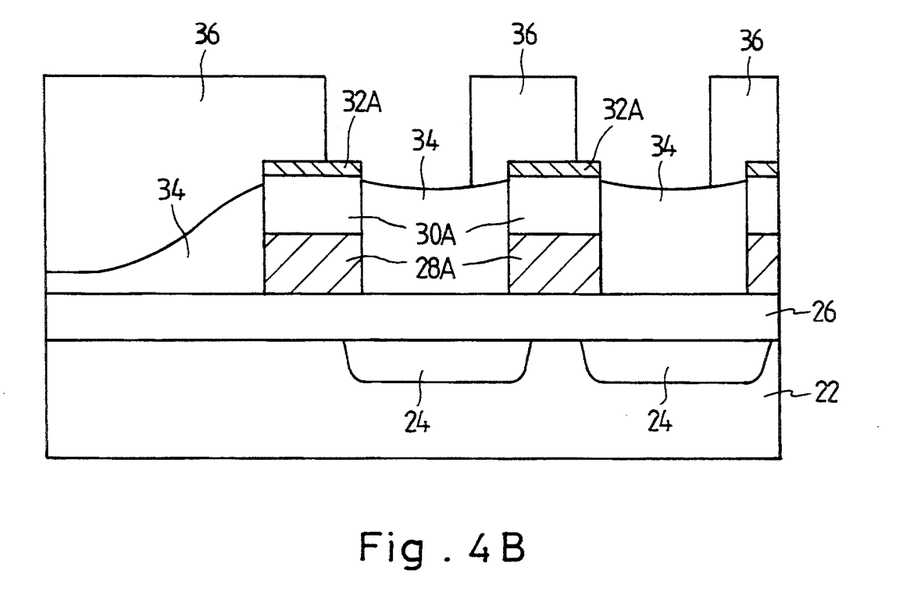

As shown in FIG. 4B, the third insulating layer 34 is etched-back to expose the upper portion of the barrier pattern 32A. A photoresist pattern 36 for contact mask is formed on the surfaces of the etched-back third insulating layer 34 and barrier layer 32A.

Figure 4C:
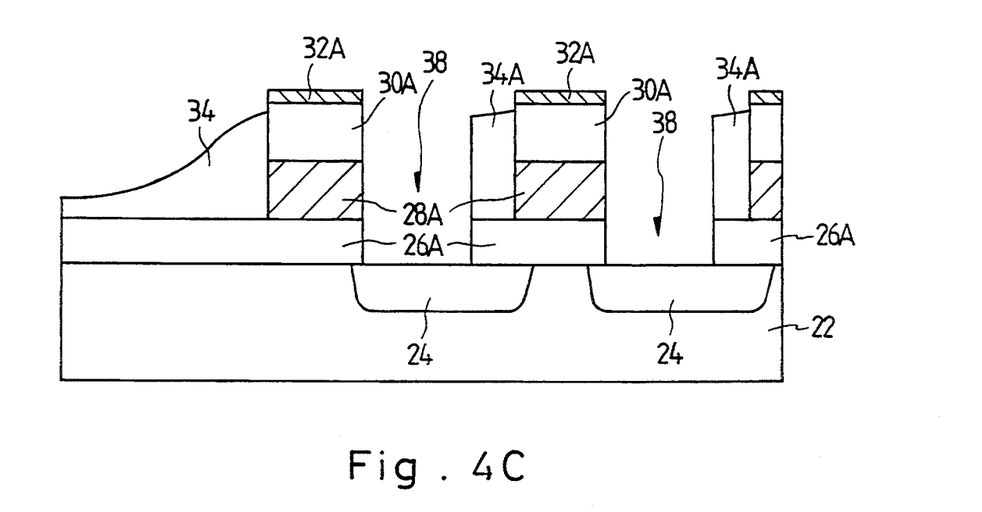

In FIG. 4C, a contact hole 38 has a sidewall consisting of a first insulating pattern 26A, first conductive pattern 28A and second insulating pattern 30A, a sidewall consisting of the first insulating pattern 26A and third insulating pattern 34A, and a lower surface of the impurity diffusion region 24. The contact hole 38 is formed together with the first insulating pattern 26A by etching the third insulating layer 34 exposed by the photoresist pattern 36 shown in FIG. 4B and the first insulating layer 26 disposed on the lower portion of the exposed third insulating layer 34. The photoresist pattern 36 is removed after etching the first and third insulating layers 26 and 34. The barrier pattern 32A prevents the second insulating pattern 30A from etching when the third insulating layer 34 is etched.

Figure 4D:
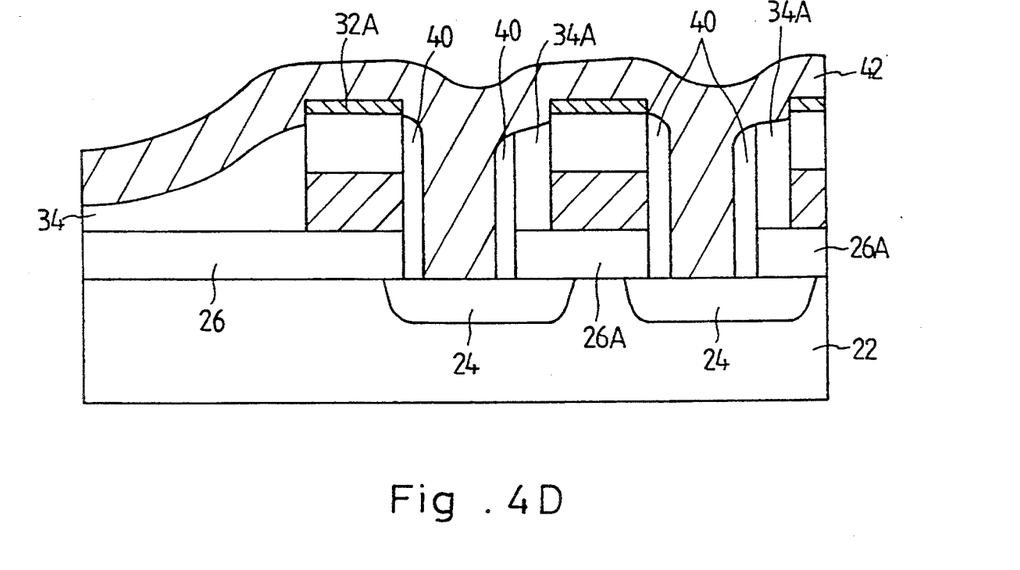

As shown in FIG. 4D, the semiconductor device further includes a spacer 40 formed along the sidewall of the contact hole 38, and a second conductive layer 42 formed on the whole surface of the substrate 22 having the contact hole 38 and barrier pattern 32A. The spacer 40 is provided by depositing an oxide layer along a sidewall of the first insulating pattern 26A, first conductive pattern 28A, second insulating pattern 30A and barrier pattern 32A, and along a sidewall of the first and third insulating patterns 26A and 34A. The second conductive layer 42 is formed by depositing a polysilicon.

Figure 4E:
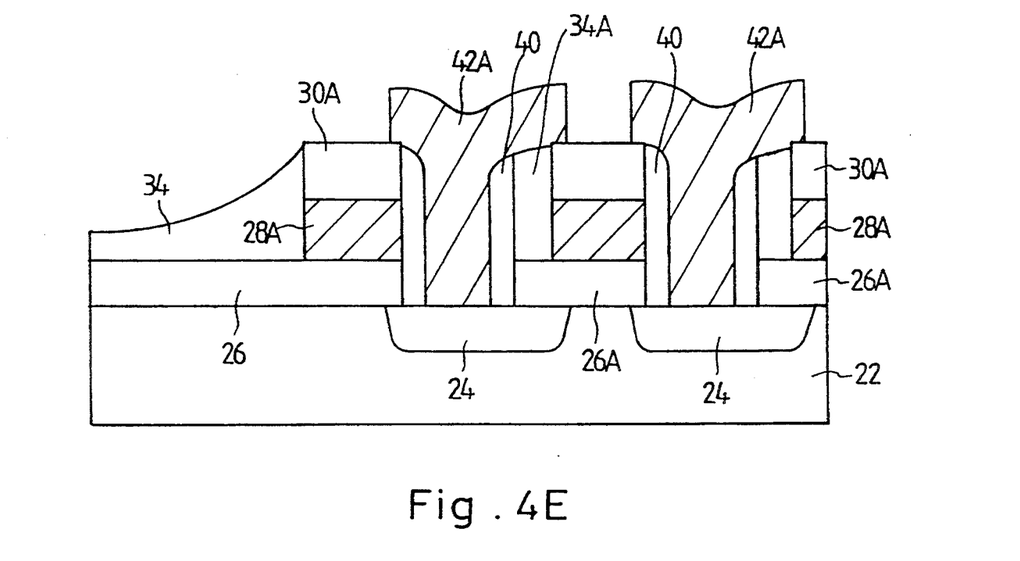

FIG. 4E illustrates steps of patterning the second conductive layer 42 and removing the barrier pattern 32B. Here, a second conductive pattern 42A is formed by etching the second conductive layer 42, using a mask for storage electrode. The barrier pattern 32A is removed together with a portion of the second conductive layer 42 selectively etched during the patterning process thereof. Meantime, when the barrier pattern 32A is formed of an insulating material, the etching process of the barrier pattern 32A may be omitted. The second conductive layer 42 other than the second conductive pattern 42A can be thoroughly removed from the surface of the third insulating layer 34 because the subsurface of the third insulating layer 34 is formed to be planarized.

FIGS. 5A to 5E are sectional views for illustrating steps of forming self-aligned contact by a second embodiment of the method for forming the contact of the semiconductor device according to the present invention.

According to the second embodiment, the method for forming the contact of the semiconductor device further includes a step of forming lower insulating layer and low conductive layer to prevent a substrate from being damaged during forming the self-aligned contact.

Figure 5A:
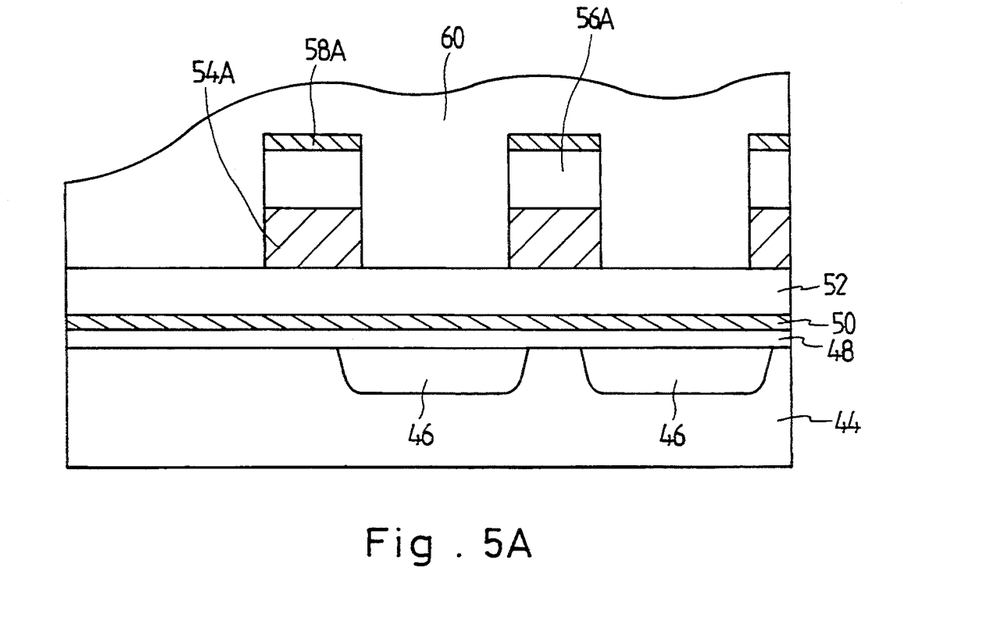
FIGS. 5A to 5E are sectional views illustrating steps of forming a self-aligned contact by a second embodiment of the method for forming the contact of the semiconductor device according to the present invention.

Referring to FIG. 5A, the semiconductor device includes a first insulating layer 48, a first conductive layer 50 and a second insulating layer 52 sequentially stacked on the surface of a substrate 44 having an impurity diffusion region 46 formed on a predetermined portion thereof, and a second conductive pattern 54A, a third insulating layer 56A and barrier pattern 58A sequentially stacked on the second insulating layer 52. The first insulating layer 48 and first conductive layer 50 are formed to protect the surface of the substrate 44 from being damaged during forming a gate electrode pattern consisting of the second conductive pattern 54A and third insulating pattern 56A and forming the contact.

Figure 5B:
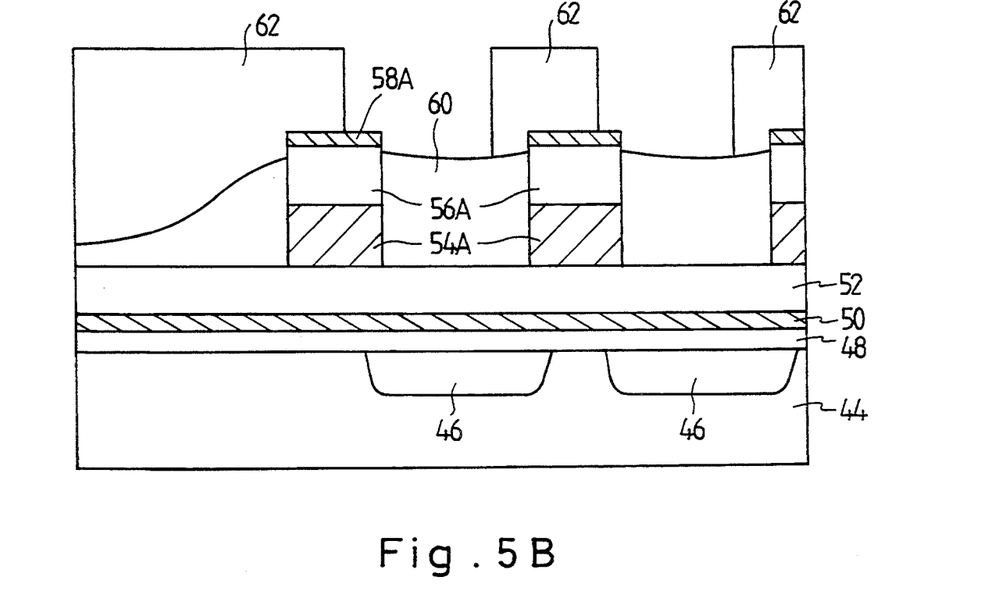

As shown in FIG. 5B, a fourth insulating layer 60 is etched-back to expose the upper portion of the barrier pattern 58A. A photoresist pattern 62 for contact mask is formed on the surface of the etched-back fourth insulating layer 60 and barrier layer 58A.

Figure 5C:
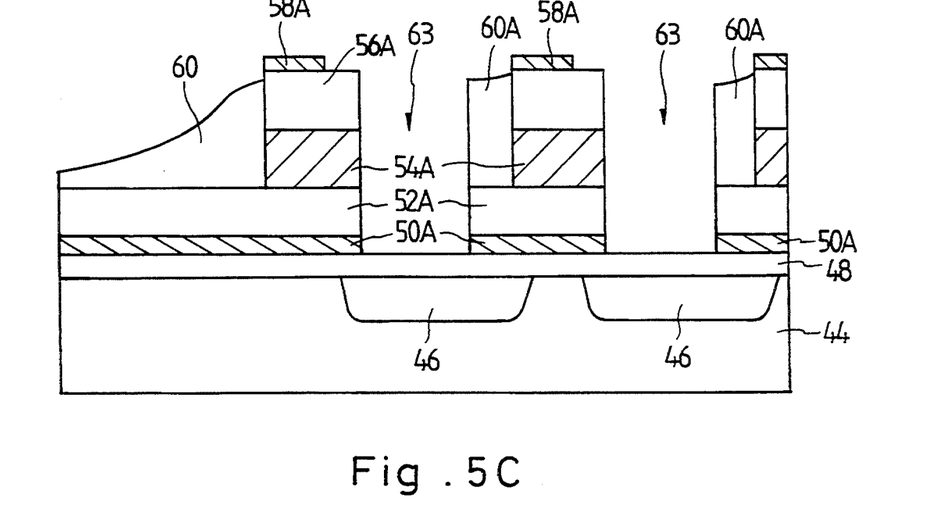

In FIG. 5C, a contact hole 63 has a sidewall consisting of the first conductive pattern 50A, second insulating pattern 52A, second conductive pattern 54A, third insulating pattern 56A, and barrier pattern 58A, an other sidewall consisting of the first conductive pattern 50A, second insulating pattern 52A and third insulating pattern 56A, and a lower surface of the first insulating layer 48. The contact hole 63 is formed together with the first conductive pattern 50A and second insulating pattern 52A by etching the fourth insulating layer 60 exposed by the photoresist pattern 62 shown in FIG. 5B, and the second insulating layer 52 and first conductive layer 50 disposed on the lower portion of the exposed fourth insulating layer 60. The portion of the barrier pattern 58A exposed by the photoresist pattern 62 is removed after the etching process of the first conductive layer 50. The photoresist pattern 62 is removed after etching the second and fourth insulating layers 52 and 60.

Figure 5D:
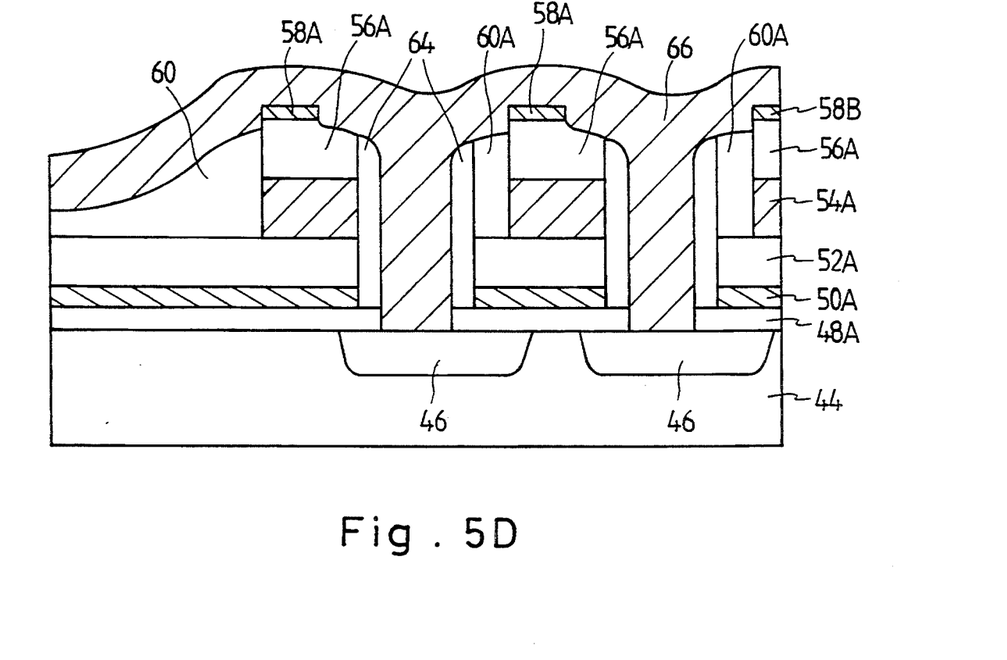

As illustrated in FIG. 5D, the semiconductor device further comprises a spacer 64 formed along the sidewall of the contact hole 63, and a third conductive layer 66 formed on the whole surface of the substrate 44 having the contact hole 63 and barrier pattern 58A to be electrically connected to the impurity diffusion region 46. The spacer 64 is formed such that an oxide layer is deposited along the sidewall of the contact hole 63 consisting of the first conductive pattern 50A, second insulating pattern 52A, second conductive pattern 54A and third insulating pattern 56A, and along the sidewall of the contact hole 63 consisting of the first conductive pattern 50A, second insulating pattern 52A and fourth insulating pattern 60A. The exposed portion of the first insulating layer 48 is etched via an etching process to form the first insulating pattern 48A and to expose the impurity diffusion region 46. The third conductive layer 66 is formed by depositing polysilicon over the substrate 44 having the exposed impurity diffusion region 46, barrier pattern 58A and a fourth insulating pattern 60A thereon.

Figure 5E:
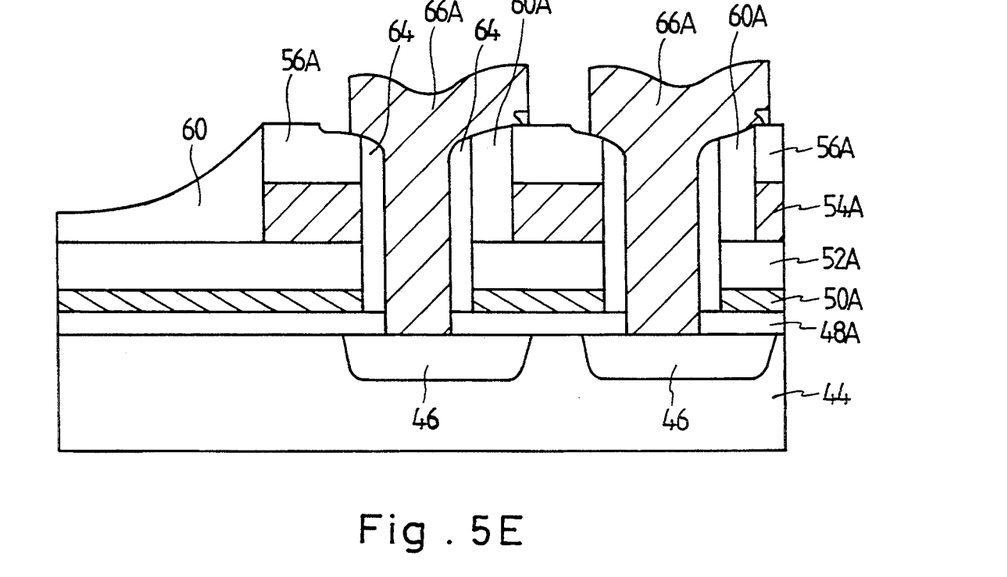

FIG. 5E illustrates steps of patterning a third conductive layer 66 and removing the barrier pattern 58A. Here, a third conductive pattern 66A is formed by etching the third conductive layer 66, using a mask for storage electrode. The barrier pattern 58A is removed together with a portion of the third conductive layer 66 which is selectively etched through the patterning process of the third conductive layer 66. If the barrier pattern 58A according to the second embodiment of the method for forming the contact of the semiconductor device formed the same as the first embodiment includes a conductive material, it must be eliminated to prevent short from adjacent contact; whereas, there is no need to eliminate the barrier pattern 58A being formed of an insulating material. Once a predetermined portion of the upper surface of the third insulating pattern 56A is removed during etching a portion of the barrier pattern 58A and fourth insulating layer 64, a portion of the third conductive pattern 66A in contact with the spacer 64 of the third conductive layer 66 and the third insulating pattern 56A is slightly curved.

According to the method for forming contact of a semiconductor device according to the present invention as described above, a barrier pattern protects a spacer from being etched to make the spacer thoroughly insulate a metal pattern for gate electrode from the contact, and the spacer can be thinned. By reducing the thickness of the spacer, the area of a self-aligned contact and the spacing between adjacent gate electrodes can be minimized. Furthermore, by using the barrier pattern to prevent the spacer from being etched, the spacer is formed to be thick enough to planarize the surface of the insulating layer between upper metal lines, thereby decreasing steps formed on the surface of an insulating interlayer and inhibiting a conductive material from being left thereon.

While the present invention has been particularly shown and described with reference to particular embodiments, it will be understood by those skilled in the art that various changes in form and details may be effected without departing from the spirit and scope of the invention. Therefore, the spirit and scope of the present invention will be defined by the appended claims.

What is claimed is:

1. A method for forming a contact of a semiconductor device having increased packing density, comprising steps of:
    forming an impurity diffusion region on an isolation region on a substrate;
    forming a first insulating layer on the surface of said substrate;
    forming a first conductive pattern and a second insulating pattern on the upper portion of said first insulating layer;
    forming an etch barrier pattern on the upper portion of said second insulating pattern;
    forming a third insulating layer on the upper potion of said etch barrier pattern and said first insulating layer, and etching said third insulating layer to expose the upper portion of said barrier pattern;
    forming a photoresist pattern for contact mask on the surfaces of said etch barrier pattern and third insulating layer;
    etching said third insulating layer and first insulating layer exposed by said photoresist pattern to form a contact hole having a lower surface being said impurity diffusion region;
    forming a spacer along the sidewall of said contact hole; and
    forming a second conductive layer on the upper portion of said substrate having said contact hole and etch barrier layer, and patterning said second conductive layer.

2. A method for forming contact of a semiconductor device as claimed in claim 1, wherein said step of forming said third insulating layer further comprises a step of planarizing the surface of said third insulating layer.

3. A method for forming contact of a semiconductor device as claimed in claim 1, wherein said third insulating layer includes a material having a property of planarizing the surface thereof.

4. A method for forming for contact of a semiconductor device as claimed in claim 1, wherein said etch barrier pattern is formed of an insulating material.

5. A method for forming contact of a semiconductor device as claimed in claim 1 further comprising a step of removing said barrier pattern exposed by said step of patterning said second conductive layer, said etch barrier pattern including a conductive material.

6. A method for forming contact of a semiconductor device as claimed in claim 1 further comprising the steps of:
    forming a lower insulating layer and a lower conductive layer between the surface of said substrate and first insulating layer during forming said spacer to prevent the lower substrate from being damaged;
    removing said first insulating layer and lower conductive layer during forming said contact hole; and
    removing said lower insulating layer to expose said impurity diffusion region after forming said spacer.

7. A method for forming a contact of a semiconductor device as claimed in claim 6, wherein said step of removing said first insulating layer and lower conductive layer comprises the step of removing the corner of said etch barrier pattern and upper corner of said second insulating pattern to curve a recessed portion of said second conductive pattern in contact with said second insulating pattern.

8. A method for forming a contact of a semiconductor device comprising the steps of:
    forming an impurity diffusion region on an isolation region on said substrate;
    forming a first insulating layer over the substrate;
    sequentially forming a first conductive layer, a second insulating layer and a etch barrier layer on the upper portion of said first insulating layer;
    patterning said first conductive layer, second insulating and etch barrier layer using a mask;
    forming a third insulating layer on the upper portion of said barrier pattern and first insulating layer, and etching said third insulating layer to expose the upper portion of said etch barrier pattern;
    forming a photoresist pattern of contact mask on the surfaces of said etch barrier pattern and third insulating layer; and
    etching said third insulating layer and first insulting layer to form a contact hole having a lower surface of said impurity diffusion region;
    forming a spacer along the sidewall of said contact hole; and
    forming a second conductive layer over the upper portion of said substrate having said contact hole and etch barrier layer, and patterning said second conductive layer.

9. A method for forming a contact of a semiconductor device comprising the steps of:
    forming an impurity diffusion region on an isolation region on a substrate;
    sequentially forming a first insulating layer, a first conductive layer and a second insulating layer on the surface of said substrate;
    sequentially forming a second conductive layer, a third insulating layer and an etch barrier layer on the upper portion of said second insulating layer;
    patterning said second conductive layer, third insulating layer, and etch barrier layer using a mask;
    forming a fourth insulating layer on the upper portion of said etch barrier pattern and second insulating layer, and etching said fourth insulating layer to expose the upper portion of said etch barrier pattern;
    forming a photoresist pattern for contact mask on the surface of said etch barrier pattern and fourth insulating layer;
    etching said fourth insulating layer, second insulating layer and first conductive layer exposed by said photoresist pattern to form a contact hole having a lower surface of said first insulating layer;
    forming a spacer along the sidewall of said contact hole;
    removing the lower surface of said contact hole of said first insulating layer to expose said impurity diffusion region; and
    forming a third conductive layer over the upper portion of said substrate having said exposed impurity diffusion region and etch barrier layer, and patterning said third conductive layer.

* * * * *